(12) United States Patent
Yang et al.

(10) Patent No.: US 11,764,166 B2
(45) Date of Patent: Sep. 19, 2023

(54) SEMICONDUCTOR PACKAGE STRUCTURE

(71) Applicants: Industrial Technology Research Institute, Hsinchu (TW); Taiwan Semiconductor Manufacturing Company, Ltd., Hsinchu (TW)

(72) Inventors: Jui-Wen Yang, New Taipei (TW); Hsin-Cheng Lai, Taoyuan (TW); Chieh-Wei Feng, Taoyuan (TW); Tai-Jui Wang, Kaohsiung (TW); Yu-Hua Chung, Pingtung County (TW); Tzu-Yang Ting, Taipei (TW)

(73) Assignees: Industrial Technology Research Institute, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 17/216,686

(22) Filed: Mar. 30, 2021

(65) Prior Publication Data
US 2022/0005768 A1 Jan. 6, 2022

(30) Foreign Application Priority Data
Jul. 3, 2020 (TW) .................................. 109122597

(51) Int. Cl.
*H01L 23/00* (2006.01)
*H01L 23/64* (2006.01)
*H01L 23/498* (2006.01)

(52) U.S. Cl.
CPC ...... *H01L 23/562* (2013.01); *H01L 23/49822* (2013.01); *H01L 23/642* (2013.01); *H01L 24/08* (2013.01); *H01L 2224/08235* (2013.01)

(58) Field of Classification Search
CPC ............ H01L 23/562; H01L 23/49822; H01L 23/642; H01L 23/24–08
See application file for complete search history.

(56) References Cited

U.S. PATENT DOCUMENTS 7,548,432 B2 6/2009 Lu et al.
9,472,425 B2 * 10/2016 Song ...................... H05K 1/185
(Continued)

FOREIGN PATENT DOCUMENTS

CN 105529310 4/2016
CN 107408550 11/2017
(Continued)

OTHER PUBLICATIONS

"Office Action of Taiwan Counterpart Application", dated Nov. 12, 2020, p. 1-p. 3.

*Primary Examiner* — Nathan W Ha
(74) *Attorney, Agent, or Firm* — JCIPRNET

(57) ABSTRACT

Provided is a semiconductor package structure including a redistribution layer (RDL) structure, a chip, an electronic device and a stress compensation layer. The RDL structure has a first surface and a second surface opposite to each other. The chip is disposed on the first surface and electrically connected to the RDL structure. The electronic device is disposed in the RDL structure, electrically connected to the chip, and includes a dielectric layer disposed therein. The stress compensation layer is disposed in or outside the RDL structure. The dielectric layer provides a first stress between 50 Mpa and 200 Mpa in a first direction perpendicular to the second surface, the stress compensation layer provides a second stress between 50 Mpa and 200 Mpa in a second direction opposite to the first direction, and the difference between the first stress and the second stress does not exceed 60 Mpa.

21 Claims, 13 Drawing Sheets

(56) References Cited

U.S. PATENT DOCUMENTS

| | | | |
|---|---|---|---|
| 10,217,724 B2* | 2/2019 | Lin | H01L 24/20 |
| 10,276,543 B1* | 4/2019 | Liao | H01L 25/50 |
| 2009/0102045 A1* | 4/2009 | Hsu | H01L 23/50 |
| | | | 257/701 |
| 2010/0013077 A1 | 1/2010 | Shin | |
| 2010/0059854 A1* | 3/2010 | Lin | H01L 21/6835 |
| | | | 257/E27.114 |
| 2010/0140736 A1* | 6/2010 | Lin | H01L 23/552 |
| | | | 257/528 |
| 2010/0237495 A1* | 9/2010 | Pagaila | H01L 23/3128 |
| | | | 257/532 |
| 2011/0062549 A1* | 3/2011 | Lin | H01L 23/642 |
| | | | 257/532 |
| 2011/0193221 A1* | 8/2011 | Hu | H01L 23/3121 |
| | | | 257/737 |
| 2012/0161315 A1* | 6/2012 | Lin | H01L 23/5389 |
| | | | 257/E23.06 |
| 2013/0075936 A1* | 3/2013 | Lin | H01L 25/105 |
| | | | 438/109 |
| 2014/0021594 A1* | 1/2014 | Yew | H01L 23/49816 |
| | | | 29/846 |
| 2016/0043068 A1* | 2/2016 | Ramachandran | H01L 27/0255 |
| | | | 257/532 |
| 2016/0113127 A1* | 4/2016 | Salminen | H05K 1/0271 |
| | | | 29/841 |
| 2016/0276173 A1* | 9/2016 | Song | H01L 23/49822 |
| 2016/0293581 A1* | 10/2016 | Lin | H01L 25/16 |
| 2017/0077022 A1* | 3/2017 | Scanlan | H01L 24/19 |
| 2018/0102313 A1* | 4/2018 | Shih | H01L 21/6835 |
| 2018/0122774 A1* | 5/2018 | Huang | H01L 24/02 |
| 2019/0139846 A1* | 5/2019 | Lu | H01L 23/49822 |
| 2019/0164912 A1* | 5/2019 | Lee | H01L 21/4857 |
| 2019/0385924 A1* | 12/2019 | Kim | H01L 23/3121 |
| 2019/0393168 A1* | 12/2019 | Park | H01L 23/562 |
| 2020/0020628 A1* | 1/2020 | Huang | H01L 24/24 |
| 2020/0075470 A1* | 3/2020 | Kuo | H01L 23/49866 |
| 2020/0105653 A1* | 4/2020 | Elsherbini | G05F 1/46 |
| 2020/0126900 A1* | 4/2020 | Ting | H01L 23/49894 |
| 2020/0243461 A1* | 7/2020 | Chiang | H01L 24/19 |
| 2020/0294914 A1* | 9/2020 | Agarwal | H01L 25/0655 |
| 2021/0035877 A1* | 2/2021 | Wu | H01L 23/16 |
| 2021/0057352 A1* | 2/2021 | Agarwal | H01L 21/4853 |
| 2021/0066188 A1* | 3/2021 | Lu | H01L 24/09 |
| 2021/0066228 A1* | 3/2021 | Lu | H01L 23/3135 |
| 2021/0098421 A1* | 4/2021 | Wu | H01L 24/16 |
| 2021/0143072 A1* | 5/2021 | Lu | H01L 23/16 |
| 2021/0175164 A1* | 6/2021 | Lu | H01L 23/49822 |
| 2021/0305223 A1* | 9/2021 | Shih | H01L 23/481 |

FOREIGN PATENT DOCUMENTS

| | | |
|---|---|---|
| EP | 3076429 | 10/2016 |
| TW | 200919676 | 5/2009 |
| TW | 201117686 | 5/2011 |
| TW | 201916306 | 4/2019 |

* cited by examiner

SEMICONDUCTOR PACKAGE STRUCTURE

CROSS-REFERENCE TO RELATED APPLICATION

This application claims the priority benefit of Taiwan application serial no. 109122597, filed on Jul. 3, 2020. The entirety of the above-mentioned patent application is hereby incorporated by reference herein.

BACKGROUND

Technical Field

The present disclosure relates to a semiconductor package structure.

Description of Related Art

In recent years, with the demand for electronic products toward higher functionality, higher speed signal transmission and higher density of circuit devices, semiconductor-related industries have also developed. In the semiconductor package process of the semiconductor industry, a chip is generally disposed on a redistribution layer (RDL) structure, and then an encapsulant is formed on the redistribution layer structure to encapsulate the chip to form a semiconductor package structure.

In addition, in order to reduce the size of the semiconductor package structure, certain active devices or passive devices can be disposed in the redistribution layer structure. However, for active or passive devices with a dielectric layer with a high dielectric constant, the dielectric layer tends to produce tensile stress or compressive stress, which may cause the semiconductor package structure to warp or curl.

SUMMARY

A semiconductor package structure of one embodiment of the present disclosure includes a redistribution layer (RDL) structure, a chip, an electronic device and a stress compensation layer. The RDL structure has a first surface and a second surface opposite to each other. The chip is disposed on the first surface and electrically connected to the RDL structure. The electronic device is disposed in the RDL structure, electrically connected to the chip, and includes a dielectric layer disposed therein. The stress compensation layer is disposed in the RDL structure. The dielectric layer provides a first stress between 50 Mpa and 200 Mpa in a first direction perpendicular to the second surface, the stress compensation layer provides a second stress between 50 Mpa and 200 Mpa in a second direction opposite to the first direction, and the difference between the first stress and the second stress does not exceed 60 Mpa.

A semiconductor package structure of one embodiment of the present disclosure includes a redistribution layer (RDL) structure, a chip, an electronic device and a stress compensation layer. The RDL structure has a first surface and a second surface opposite to each other. The chip is disposed on the first surface and electrically connected to the RDL structure. The electronic device is disposed in the RDL structure, electrically connected to the chip, and includes a dielectric layer disposed therein. The stress compensation layer is disposed outside the RDL structure. The dielectric layer provides a first stress between 50 Mpa and 200 Mpa in a first direction perpendicular to the second surface, the stress compensation layer provides a second stress between 50 Mpa and 200 Mpa in a second direction opposite to the first direction, and the difference between the first stress and the second stress does not exceed 60 Mpa.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
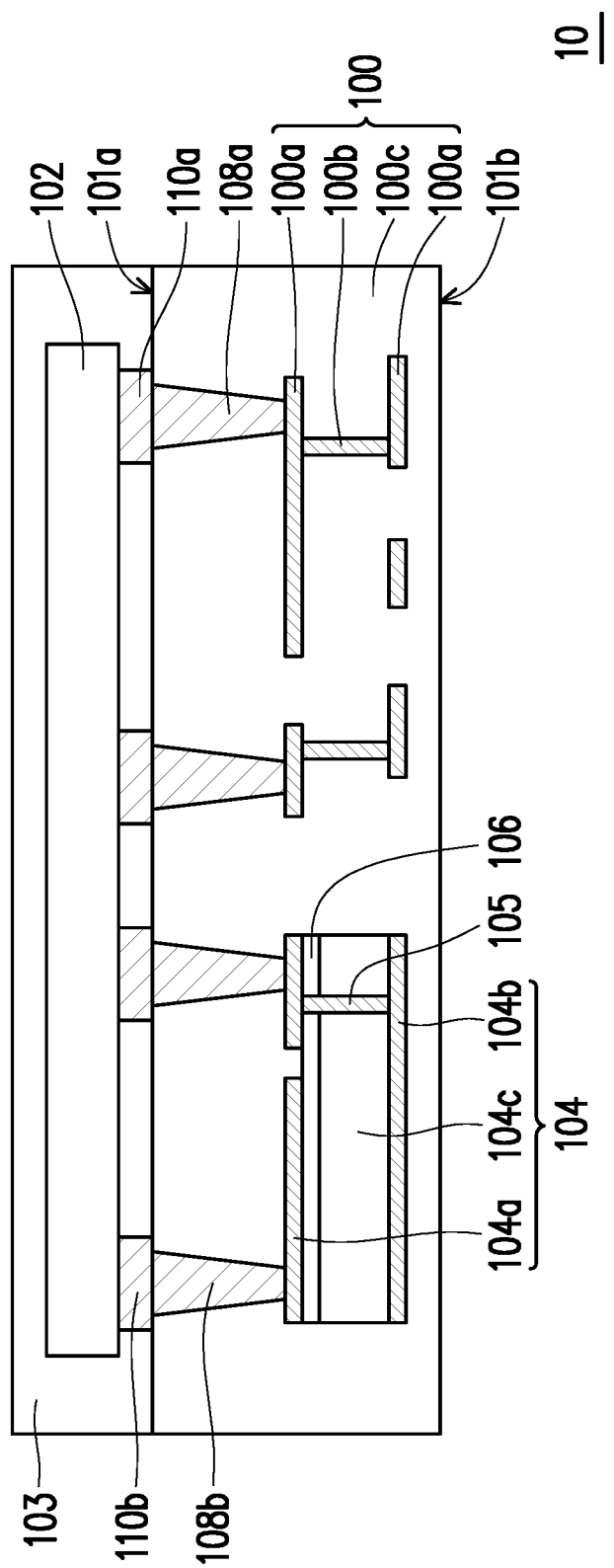
FIG. 1 is a schematic cross-sectional view of a semiconductor package structure according to the first embodiment of the present disclosure.

The embodiments are described in detail below with reference to the accompanying drawings, but the embodiments are not intended to limit the scope of the present disclosure. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit the present disclosure.

FIG. 1 is a schematic cross-sectional view of a semiconductor package structure according to the first embodiment of the present disclosure. Referring to FIG. 1, the semiconductor package structure 10 of this embodiment includes a redistribution layer structure 100, a chip 102, an electronic device 104 and a stress compensation layer 106. The redistribution layer structure 100 has a first surface 101a and a second surface 101b opposite to each other. The redistribution layer structure 100 includes circuit layers 100a, contacts 100b connecting the circuit layers 100a, and an insulating layer 100c. The circuit layers 100a and the contacts 100b are disposed in the insulating layer 100c, and the circuit layers 100a are separated from each other by the insulating layer 100c. In this embodiment, in order to make the drawings clear, only two circuit layers 100a are depicted, but the disclosure is not limited thereto. In other embodiments, the redistribution layer structure may include more circuit layers according to actual requirements. In addition, this disclosure does not limit the layout of the redistribution layer structure and the materials of each component.

The chip 102 is disposed on the first surface 101a of the redistribution layer structure 100, and is electrically connected to the redistribution layer structure 100. In detail, the chip 102 is electrically connected to the redistribution layer structure 100 through the conductive vias 108a disposed in the insulating layer 100c and the pads 110a disposed on the first surface 101a of the redistribution layer structure 100 and connected to the conductive vias 108a. The chip 102 may be connected to the pads 110a through pads (not shown) disposed on its active surface. However, the chip 102 may be electrically connected to the redistribution layer structure 100 in any other well-known manner, which is not limited in the present disclosure. The chip 102 may be various well-known chips, such as a memory chip, a control chip, etc., which is not limited in the present disclosure. In addition, the encapsulant 103 is disposed on the first surface 101a of the redistribution layer structure 100 and encapsulates the chip 102 to prevent the chip 102 from being damaged.

The electronic device 104 is disposed in the redistribution layer structure 100, and is electrically connected to the chip 102. In detail, the chip 102 is electrically connected to the electronic device 104 through the conductive vias 108b disposed in the insulating layer 100c and the pads 110b disposed on the first surface 101a of the redistribution layer structure 100 and connected to the conductive vias 108b. The chip 102 may be connected to the pads 110b through pads (not shown) disposed on its active surface. However, the chip 102 may be electrically connected to the electronic device 104 in any other well-known manner, which is not limited in this disclosure.

In this embodiment, the electronic device 104 is a device including a dielectric layer with a high dielectric constant (for example, greater than 3.9). The material of the dielectric layer is, for example, zinc oxide, titanium oxide, tantalum oxide, aluminum oxide, or a combination thereof. That is, as long as a capacitor, a resistor, an inductor, a filter, an antenna, a transistor, or combination thereof with a dielectric layer having a high dielectric constant may be used as the electronic device 104 in this embodiment. Therefore, in the following, a capacitor will be exemplarily adopted as the electronic device 104, but the present disclosure is not limited thereto. In addition, generally speaking, when a dielectric layer with a high dielectric constant is disposed in the electronic device 104, a first stress may be provided in a first direction perpendicular to the second surface 101b of the redistribution layer structure 100 depend on the material of the dielectric layer. This is further explained.

In this embodiment, taking a capacitor as an example, the electronic device 104 includes an upper electrode 104a, a lower electrode 104b, and a dielectric layer 104c between the upper electrode 104a and the lower electrode 104b. The upper electrode 104a and the lower electrode 104b are electrically connected through a conductive via 105. The dielectric layer 104c has a high dielectric constant (for example, greater than 3.9) and serves as a capacitor dielectric layer of the capacitor. The detailed structures and materials of the upper electrode 104a and the lower electrode 104b are well known to those skilled in the art, and will not be described here. In this embodiment, for ease of description, a plate capacitor is taken as an example to describe the electronic device 104, but the present disclosure is not limited thereto. In other embodiments, the electronic device 104 may also be other types of capacitors, as long as a dielectric layer with a high dielectric constant is used as the capacitor dielectric layer.

The stress compensation layer 106 is disposed in the redistribution layer structure 100. In detail, in this embodiment, the stress compensation layer 106 is disposed between the upper electrode 104a and the dielectric layer 104c. The material of the stress compensation layer 106 is, for example, silicon oxide, silicon nitride, aluminum oxide, or a combination thereof. The stress compensation layer 106 is used to reduce or offset the first stress provided by the dielectric layer 104c. Therefore, depending on the first stress provided by the dielectric layer 104c, the stress compensation layer 106 is provide a second stress in a second direction opposite to the first direction. For example, when the dielectric layer 104c provides tensile stress in the first direction perpendicular to the second surface 101b of the redistribution layer structure 100, the stress compensation layer 106 provides compressive stress in the second direction. On the contrary, when the dielectric layer 104c provides compressive stress in the first direction perpendicular to the second surface 101b of the redistribution layer structure 100, the stress compensation layer 106 provides tensile stress in the second direction. In this embodiment, the first stress provided by the dielectric layer 104c is between 50 Mpa and 200 Mpa, the second stress provided by the stress compensation layer 106 is between 50 Mpa and 200 Mpa, and the difference between the first stress and the second stress does not exceed 60 Mpa. In this way, the first stress generated by the dielectric layer 104c may be reduced or offset, so that the warpage or the curl of the semiconductor package structure 10 may be avoided. As shown in Table 1, when a warpage test is performed on a film (for example, glass film), if the stress difference between the opposite directions does not exceed 60 Mpa, the warpage of the film is not obvious and belongs to an acceptable level. The warpage test includes applying stress to a rectangular film in opposite directions, and measuring the warpage values at the four sides (position A, position B, position C, and position D) of the rectangular film.

TABLE 1

| stress difference (Mpa) | warpage value (mm) | | | |
|---|---|---|---|---|
| | position A | position B | position C | position D |
| 0 | 0 | 0 | 0 | 0 |
| 16 | 0 | 0 | 0 | 0 |
| 59 | 0 | 0 | 0 | 0 |
| 107 | 0.01 | 0.02 | 0.01 | 0.01 |
| 181 | 0.03 | 0.04 | 0.04 | 0.03 |
| 273 | 0.05 | 0.06 | 0.05 | 0.07 |
| 389 | 0.07 | 0.07 | 0.07 | 0.08 |
| 414 | 0.08 | 0.08 | 0.08 | 0.08 |
| 482 | 0.08 | 0.1 | 0.08 | 0.09 |

When the material of the stress compensation layer 106 and the dielectric layer in the electronic device 104 is alumina, the respective stresses of the stress compensation layer 106 and the dielectric layer in the electronic device 104 may be adjusted by adjusting the thickness of the film, the film deposition rate, the film deposition temperature, the gas flow ratio during the deposition process or the annealing temperature.

In the first embodiment, the stress compensation layer 106 is disposed in the redistribution layer structure 100, and is located in the electronic device 104, so as to achieve the purpose of reducing or offsetting the stress provided by the dielectric layer 104c, but the present disclosure is not limited thereto. In other embodiments, the stress compensation layer 106 may be disposed at other positions in the redistribution layer structure 100.

Figure 12:
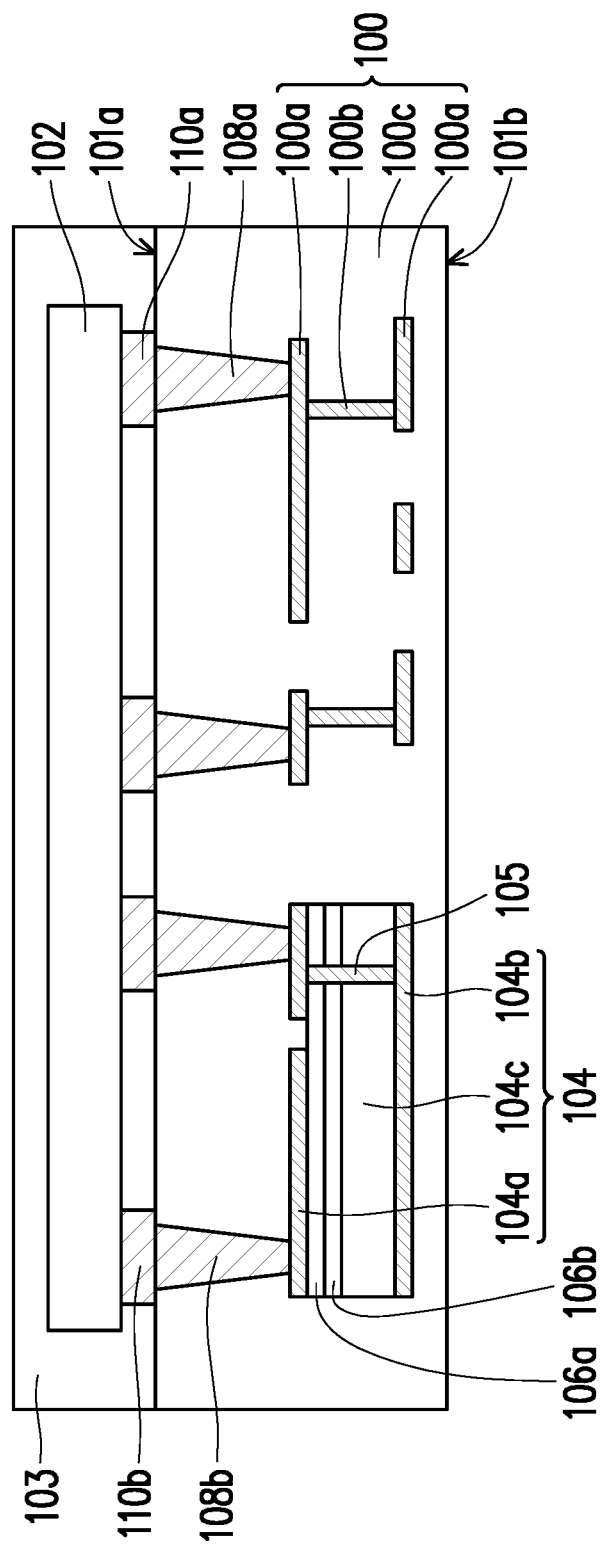
FIG. 12 is a schematic cross-sectional view of a semiconductor package structure according to another embodiment of the present disclosure.

In addition, in the present disclosure, the stress compensation layer 106 may be a single layer or multiple layers, and in the case of multiple layers, the materials of two adjacent layers may be different from each other. In the first embodiment, the stress compensation layer 106 is a single layer. In another embodiment, the stress compensation layer 106 may be a two-layer structure composed of a stress compensation layer 106a and a stress compensation layer 106b, as shown in FIG. 12. In other embodiments, the stress compensation layer 106 may be a three-layer structure or a multi-layer structure with more layers. In an embodiment where the stress compensation layer 106 is a multi-layer structure, the first stress provided by the dielectric layer 104c is between 50 Mpa and 200 Mpa, the total stress provided by the stress compensated layers is the second stress, the second stress is between 50 Mpa and 200 Mpa, and the difference between the first stress and the second stress does not exceed 60 Mpa.

Figure 2:
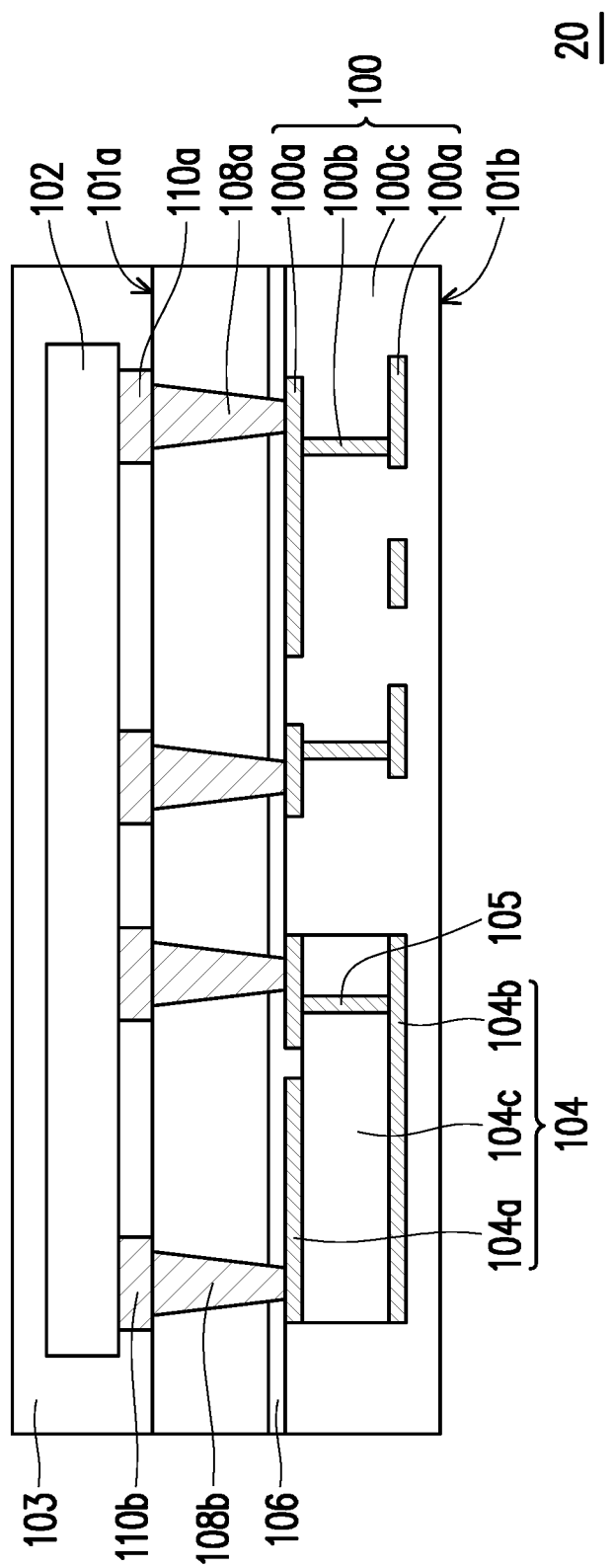
FIG. 2 is a schematic cross-sectional view of a semiconductor package structure according to the second embodiment of the present disclosure.

FIG. 2 is a schematic cross-sectional view of a semiconductor package structure according to the second embodiment of the present disclosure. In this embodiment, the same elements as in the first embodiment will be denoted by the same element symbols, and will not be described again.

Referring to FIG. 2, in this embodiment, the difference from the first embodiment is that in the semiconductor package structure 20, the stress compensation layer 106 is disposed in the redistribution layer structure 100, and is located above the electronic device 104 and the circuit layer 100a of the redistribution layer structure 100. In detail, in this embodiment, the stress compensation layer 106 covers the upper electrode 104a of the electronic device 104 and the uppermost circuit layer 100a. In addition, the conductive vias 108a pass through the stress compensation layer 106 above the circuit layers 100a and are connected to the uppermost circuit layer 100a to electrically connect the circuit layers 100a and the pads 110a, and the conductive vias 108b pass through the stress compensation layer 106 above the electronic device 104 and are electrically connected to the upper electrode 104a to electrically connect the electronic device 104 and the pads 110b.

In addition, in this embodiment, the stress compensation layer 106 is in contact with the upper electrode 104a and the uppermost circuit layer 100a, but the present disclosure is not limited thereto. In other embodiments, the stress compensation layer 106 may also be separated from the upper electrode 104a and the uppermost circuit layer 100a by a distance.

In this embodiment, since the stress compensation layer 106 is disposed in the redistribution layer structure 100, the stress generated by the dielectric layer 104c in the electronic device 104 may be reduced or offset by the stress compensation layer 106, so that the warpage or the curl of the semiconductor package structure 20 may be avoided.

Figure 3:
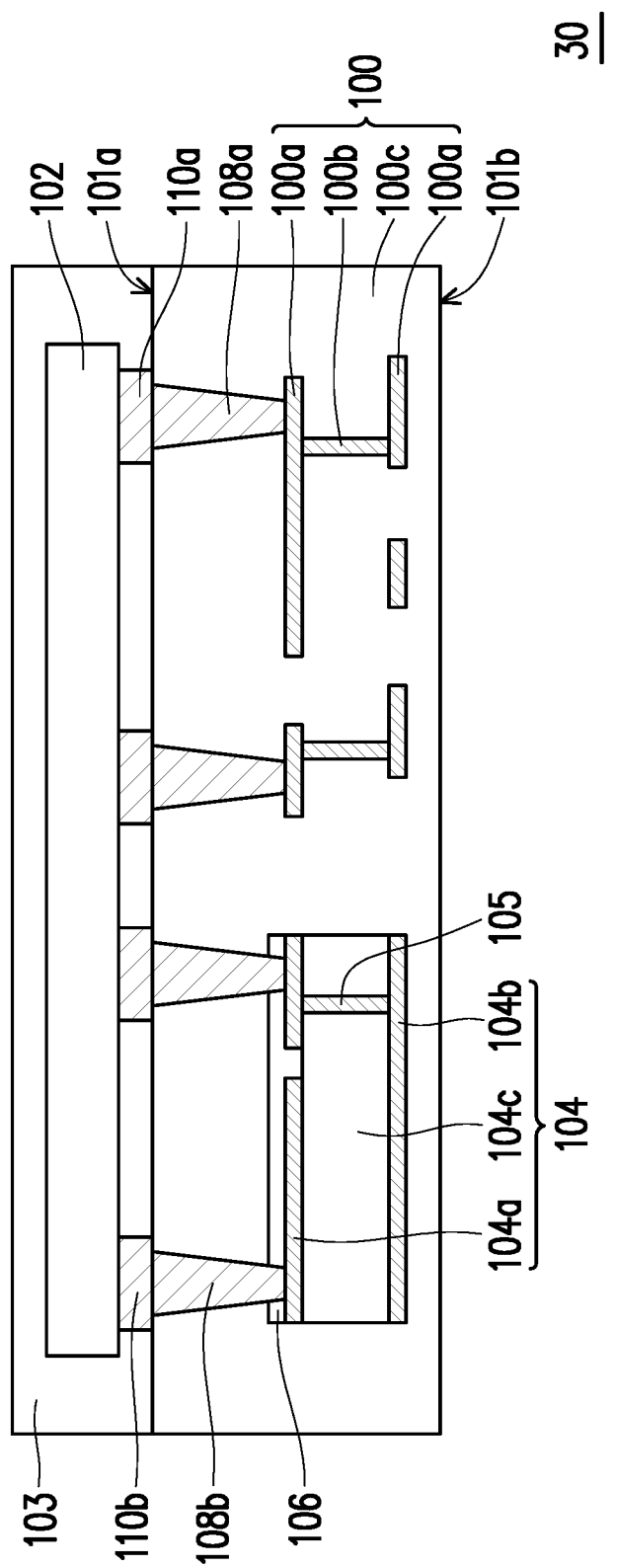
FIG. 3 is a schematic cross-sectional view of a semiconductor package structure according to the third embodiment of the present disclosure.

FIG. 3 is a schematic cross-sectional view of a semiconductor package structure according to the third embodiment of the present disclosure. In this embodiment, the same elements as in the first embodiment will be denoted by the same element symbols, and will not be described again.

Referring to FIG. 3, in this embodiment, the difference from the second embodiment is that in the semiconductor package structure 30, the stress compensation layer 106 is disposed in the redistribution layer structure 100 and is only located above the electronic device 104. In detail, in this embodiment, the stress compensation layer 106 covers the upper electrode 104a of the electronic device 104, and the stress compensation layer 106 and the dielectric layer 104c in the electronic device 104 have substantially the same size or the same projected area. That is, the stress compensation layer 106 is provided corresponding to the dielectric layer 104c. In addition, the conductive vias 108b pass through the stress compensation layer 106 above the electronic device 104 and are electrically connected to the upper electrode 104a to electrically connect the electronic device 104 and the pads 110b.

In addition, in this embodiment, the stress compensation layer 106 is in contact with the upper electrode 104a, but the present disclosure is not limited thereto. In other embodiments, the stress compensation layer 106 may also be separated from the upper electrode 104a by a distance.

In this embodiment, since the stress compensation layer 106 is disposed in the redistribution layer structure 100, the stress generated by the dielectric layer 104c in the electronic device 104 may be reduced or offset by the stress compensation layer 106, so that the warpage or the curl of the semiconductor package structure 30 may be avoided.

Figure 4:
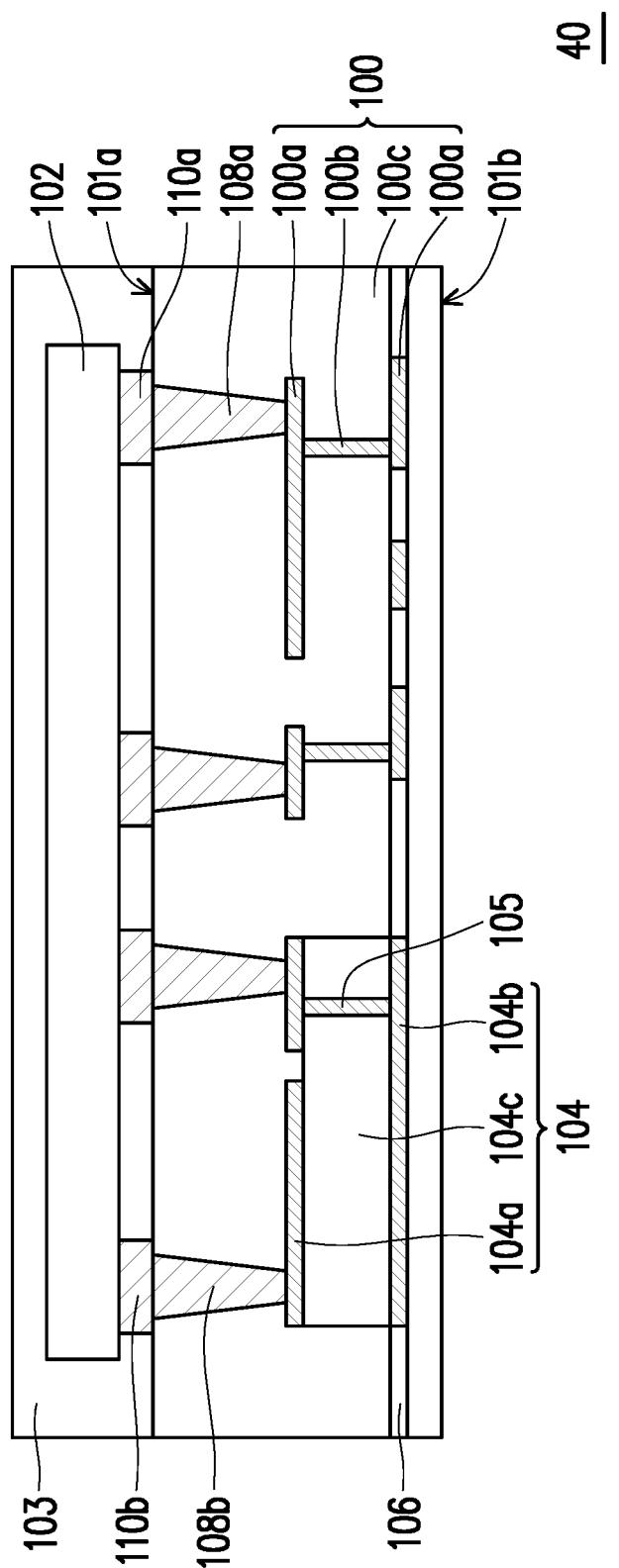
FIG. 4 is a schematic cross-sectional view of a semiconductor package structure according to the fourth embodiment of the present disclosure.

FIG. 4 is a schematic cross-sectional view of a semiconductor package structure according to the fourth embodiment of the present disclosure. In this embodiment, the same elements as in the first embodiment will be denoted by the same element symbols, and will not be described again.

Referring to FIG. 4, in this embodiment, the difference from the first embodiment is that in the semiconductor package structure 40, the stress compensation layer 106 is disposed in the redistribution layer structure 100, and is located around the electronic device 104 and the circuit layer 100a of the redistribution layer structure 100. In detail, in this embodiment, the stress compensation layer 106 is located around the lower electrode 104b of the electronic device 104 and the lowermost circuit layer 100a of the redistribution layer structure 100, but the present disclosure is not limited thereto. In other embodiments, the stress compensation layer 106 may also be located around the upper electrode 104a of the electronic device 104 and the uppermost circuit layer 100a of the redistribution layer structure 100, or the stress compensation layer 106 may also be located at other locations around the electronic device 104 and the circuit layers 100*a*.

In this embodiment, since the stress compensation layer 106 is disposed in the redistribution layer structure 100, the stress generated by the dielectric layer 104*c* in the electronic device 104 may be reduced or offset by the stress compensation layer 106, so that the warpage or the curl of the semiconductor package structure 40 may be avoided.

Figure 5:
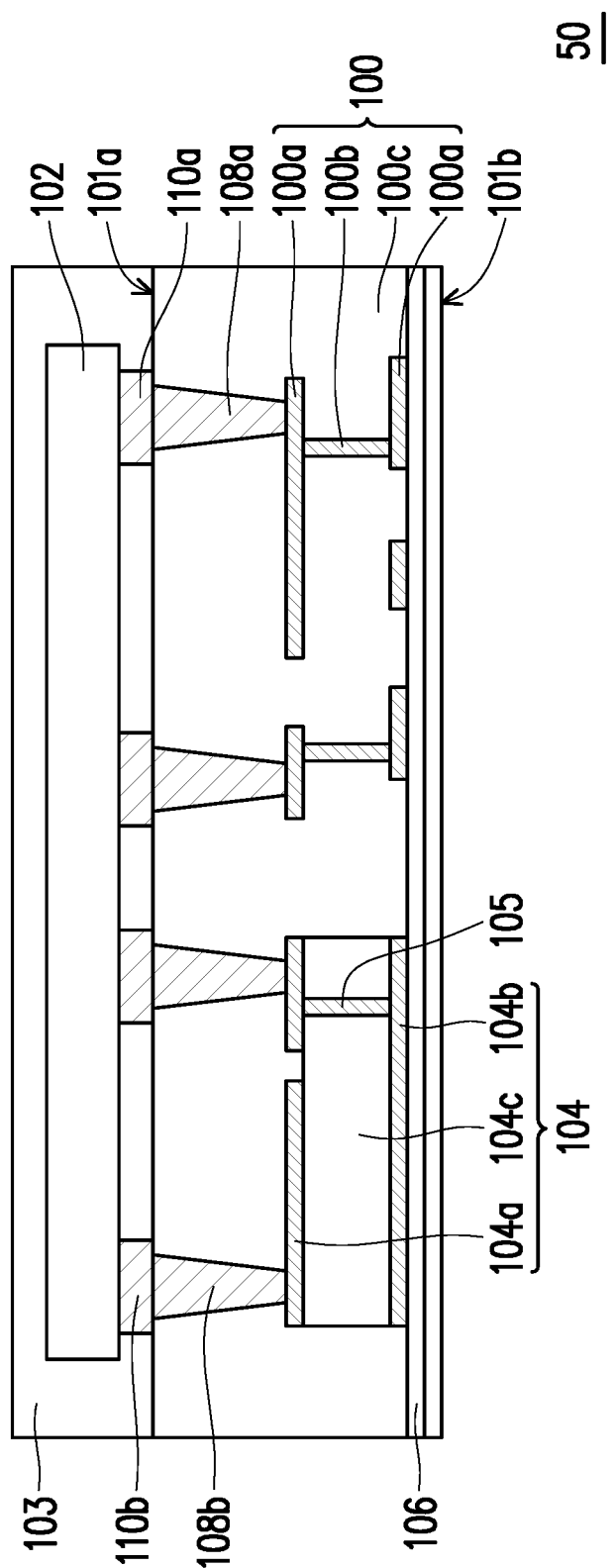
FIG. 5 is a schematic cross-sectional view of a semiconductor package structure according to the fifth embodiment of the present disclosure.

FIG. 5 is a schematic cross-sectional view of a semiconductor package structure according to the fifth embodiment of the present disclosure. In this embodiment, the same elements as in the first embodiment will be denoted by the same element symbols, and will not be described again.

Referring to FIG. 5, in this embodiment, the difference from the first embodiment is that in the semiconductor package structure 50, the stress compensation layer 106 is disposed in the redistribution layer structure 100, and is located under the electronic device 104 and the circuit layers 100*a* of the redistribution layer structure 100. In detail, in this embodiment, the stress compensation layer 106 covers the lower electrode 104*b* of the electronic device 104 and the lowermost circuit layer 100*a*.

In addition, in this embodiment, the stress compensation layer 106 is in contact with the lower electrode 104*b* and the lowermost circuit layer 100*a*, but the present disclosure is not limited thereto. In other embodiments, the stress compensation layer 106 may also be separated from the lower electrode 104*b* and the lowermost circuit layer 100*a* by a distance.

In this embodiment, since the stress compensation layer 106 is disposed in the redistribution layer structure 100, the stress generated by the dielectric layer 104*c* in the electronic device 104 may be reduced or offset by the stress compensation layer 106, so that the warpage or the curl of the semiconductor package structure 50 may be avoided.

Figure 6:
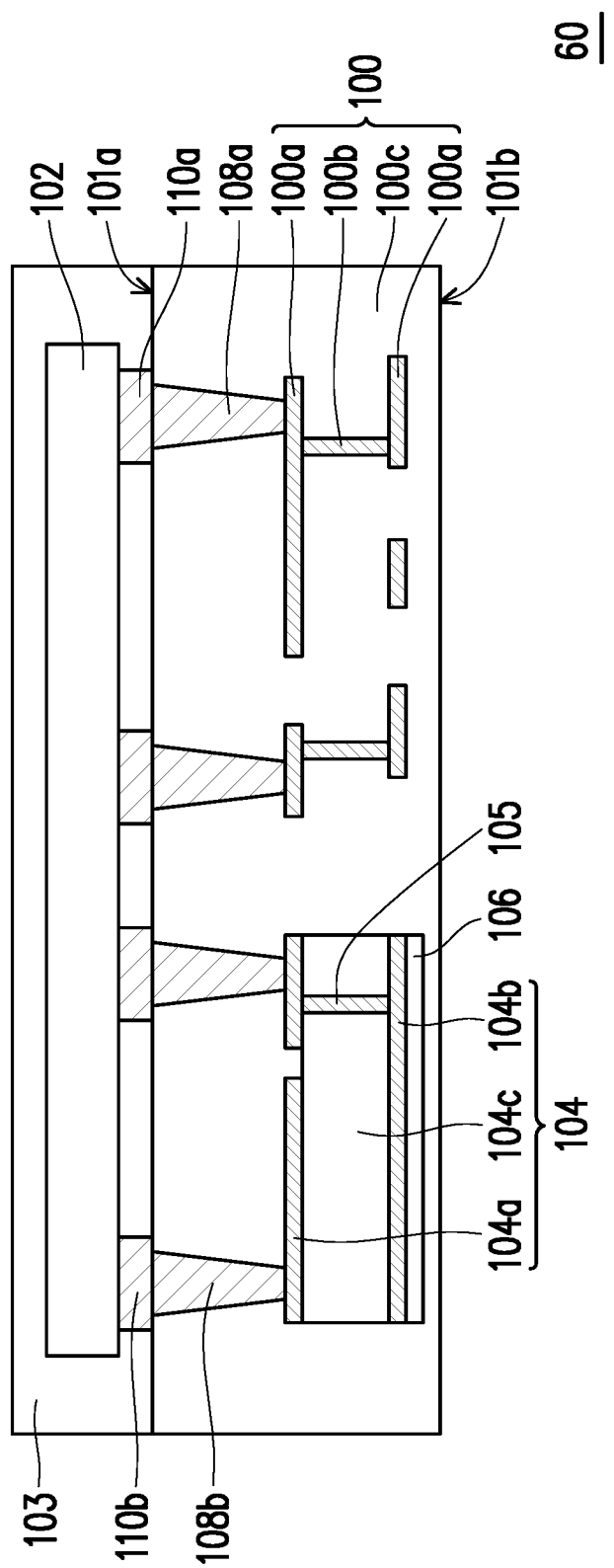
FIG. 6 is a schematic cross-sectional view of a semiconductor package structure according to the sixth embodiment of the present disclosure.

FIG. 6 is a schematic cross-sectional view of a semiconductor package structure according to the sixth embodiment of the present disclosure. In this embodiment, the same elements as in the first embodiment will be denoted by the same element symbols, and will not be described again.

Referring to FIG. 6, in this embodiment, the difference from the fifth embodiment is that in the semiconductor package structure 60, the stress compensation layer 106 is disposed in the redistribution layer structure 100 and is only located under the electronic device 104. In detail, in this embodiment, the stress compensation layer 106 is directly disposed in contact with the lower electrode 104*b* of the electronic component 104, and the stress compensation layer 106 and the dielectric layer 104*c* in the electronic device 104 have substantially the same size or the same projected area. That is, the stress compensation layer 106 is disposed corresponding to the dielectric layer 104*c*.

In addition, in this embodiment, the stress compensation layer 106 is in contact with the lower electrode 104*b*, but the present disclosure is not limited thereto. In other embodiments, the stress compensation layer 106 may also be separated from the lower electrode 104*b* by a distance.

In this embodiment, since the stress compensation layer 106 is disposed in the redistribution layer structure 100, the stress generated by the dielectric layer 104*c* in the electronic device 104 may be reduced or offset by the stress compensation layer 106, so that the warpage or the curl of the semiconductor package structure 60 may be avoided.

In the above embodiments, the stress compensation layer 106 is disposed in the redistribution layer structure 100 to reduce or offset the stress generated by the dielectric layer 104*c* in the electronic device 104, but the application is not limited thereto. In other embodiments, the stress compensation layer 106 may also be disposed outside the redistribution layer structure 100, and may still reduce or offset the stress generated by the dielectric layer 104*c* in the electronic device 104, which will be further described below.

Figure 7:
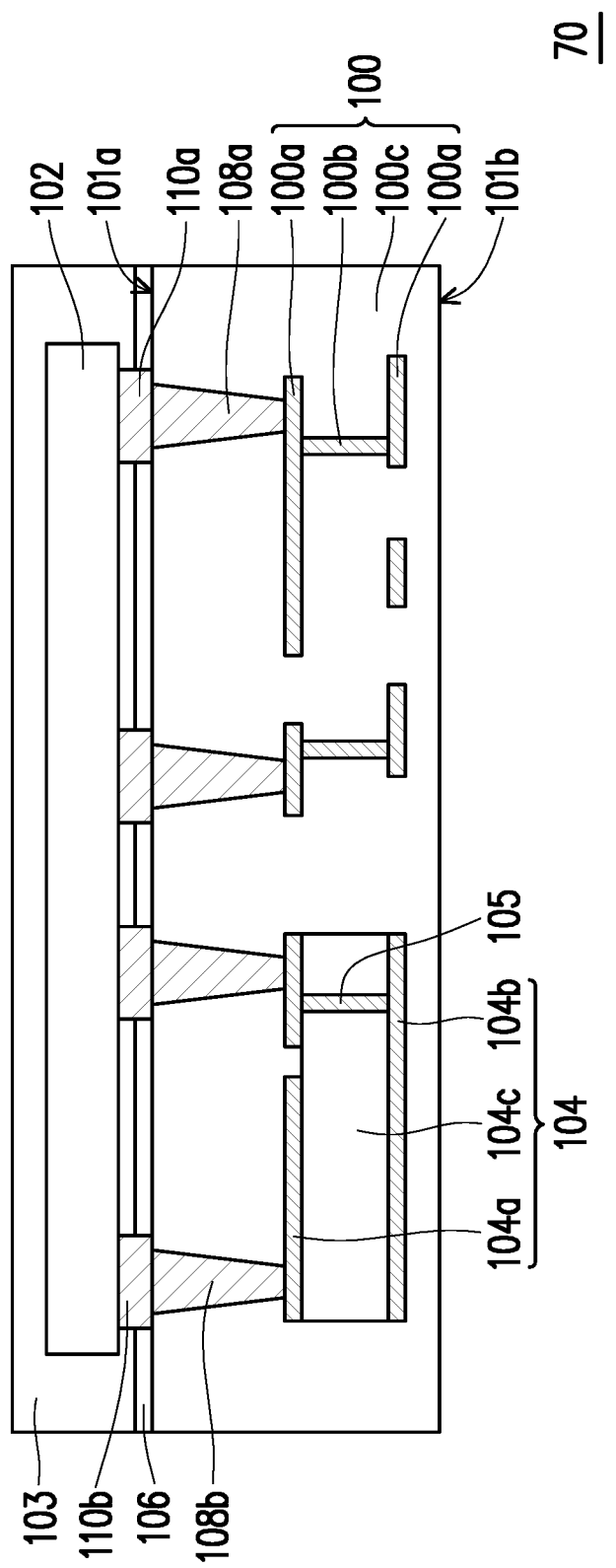
FIG. 7 is a schematic cross-sectional view of a semiconductor package structure according to the seventh embodiment of the present disclosure.

FIG. 7 is a schematic cross-sectional view of a semiconductor package structure according to the seventh embodiment of the present disclosure. In this embodiment, the same elements as in the first embodiment will be denoted by the same element symbols, and will not be described again.

Referring to FIG. 7, in this embodiment, the difference from the first embodiment is that in the semiconductor package structure 70, the stress compensation layer 106 is disposed on the redistribution layer structure 100 and is located on the first surface 101*a* of the redistribution layer structure 100. In detail, in this embodiment, the stress compensation layer 106 is disposed between the insulating layer 100*c* of the redistribution layer structure 100 and the encapsulant 103, and is located around the pads 110*a* and the pads 110*b*.

In this embodiment, since the stress compensation layer 106 is disposed on the surface of the redistribution layer structure 100, the stress generated by the dielectric layer 104*c* in the electronic device 104 may be reduced or offset by the stress compensation layer 106, so that the warpage or the curl of the semiconductor package structure 70 may be avoided.

Figure 8:
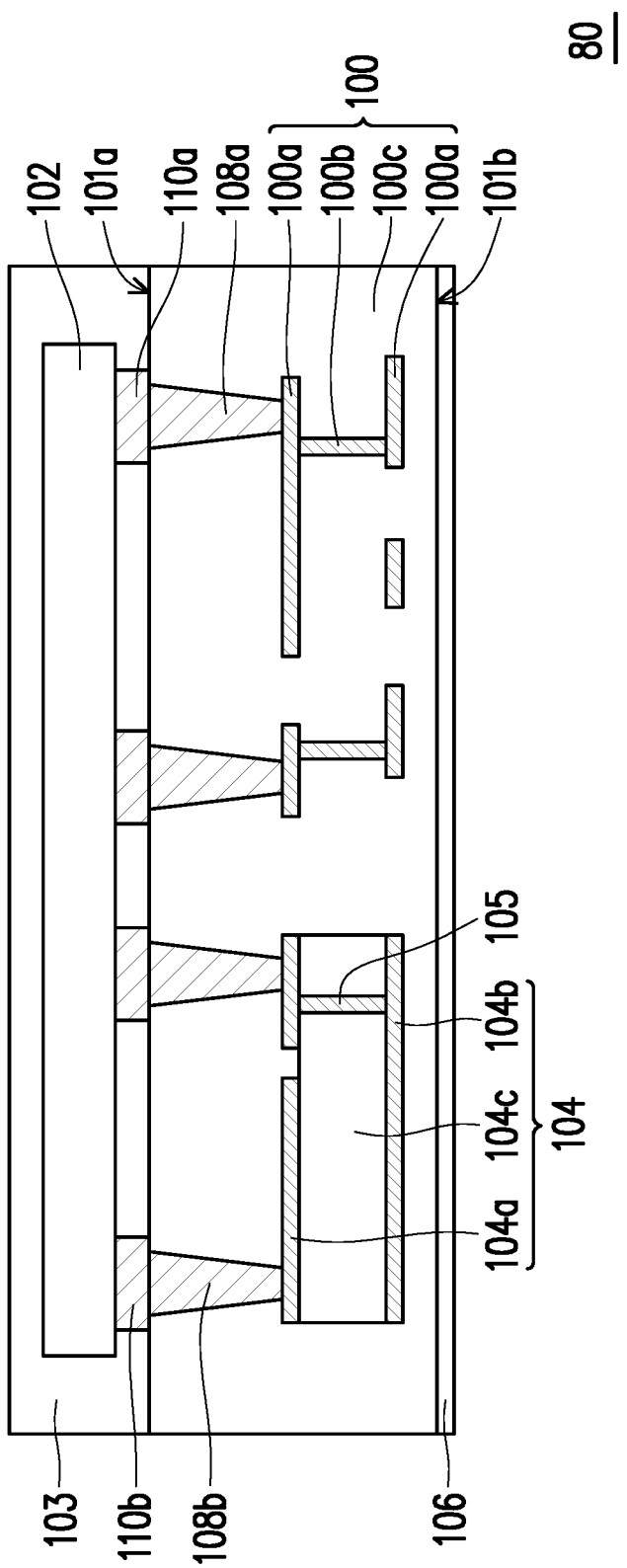
FIG. 8 is a schematic cross-sectional view of a semiconductor package structure according to the eighth embodiment of the present disclosure.

FIG. 8 is a schematic cross-sectional view of a semiconductor package structure according to the eighth embodiment of the present disclosure. In this embodiment, the same elements as in the first embodiment will be denoted by the same element symbols, and will not be described again.

Referring to FIG. 8, in this embodiment, the difference from the seventh embodiment is that in the semiconductor package structure 80, the stress compensation layer 106 is disposed on the redistribution layer structure 100 and is located on the second surface 101*b* of the redistribution layer structure 100.

In this embodiment, since the stress compensation layer 106 is disposed on the surface of the redistribution layer structure 100, the stress generated by the dielectric layer 104*c* in the electronic device 104 may be reduced or offset by the stress compensation layer 106, so that the warpage or the curl of the semiconductor package structure 80 may be avoided.

Figure 13:
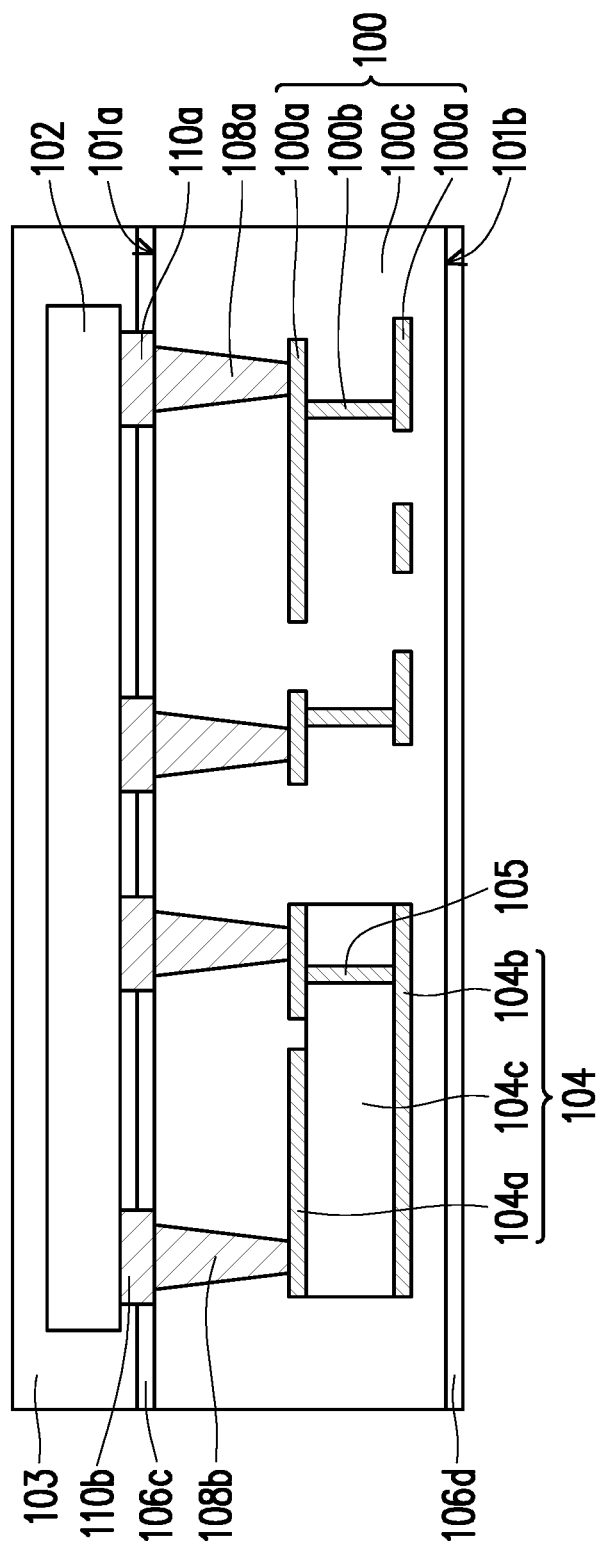
FIG. 13 is a schematic cross-sectional view of a semiconductor package structure according to another embodiments of the present disclosure.

In addition, in another embodiment, as described in the seventh embodiment and the eighth embodiment, stress compensated layers may be disposed on the first surface 101*a* and the second surface 101*b* of the redistribution layer structure 100 at the same time. As shown in FIG. 13, a stress compensation layer 106*c* is disposed on the first surface 101*a* of the redistribution layer structure 100, and a stress compensation layer 106*d* is disposed on the second surface 101*b* of the redistribution layer structure 100. The materials of the stress compensation layer 106*c* and the stress compensation layer 106*d* may be the same or different from each other. In this embodiment, the first stress provided by the dielectric layer 104*c* is between 50 Mpa and 200 Mpa, the total stress provided by the stress compensation layer 106*c* and the stress compensation layer 106*d* is the second stress, the second stress is between 50 Mpa and 200 Mpa, and the difference between the first stress and the second stress does not exceed 60 Mpa.

In the above embodiments, the electronic device 104 and the circuit layers 100*a* of the redistribution layer structure 100 are disposed at substantially the same level, but the application is not limited thereto. In other embodiments, the electronic device 104 and the circuit layers 100a of the redistribution layer structure 100 may be disposed at different levels, which will be further described below.

Figure 9:
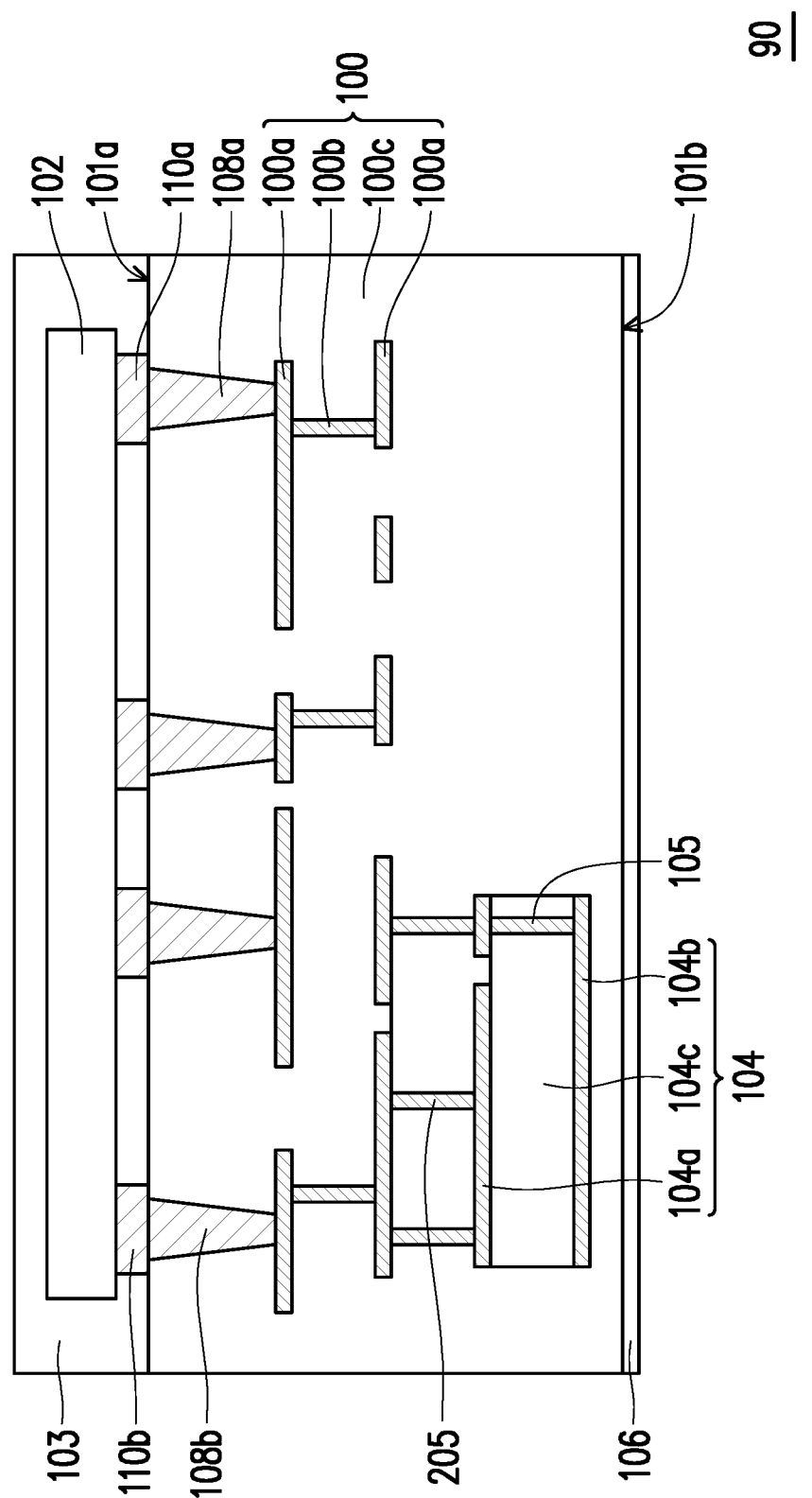
FIG. 9 is a schematic cross-sectional view of a semiconductor package structure according to the ninth embodiment of the present disclosure.

FIG. 9 is a schematic cross-sectional view of a semiconductor package structure according to the ninth embodiment of the present disclosure. In this embodiment, the same elements as in the first embodiment will be denoted by the same element symbols, and will not be described again.

Referring to FIG. 9, in this embodiment, the difference from the eighth embodiment is that in the semiconductor package structure 90, the electronic device 104 is disposed under the circuit layers 100a of the redistribution layer structure 100. In addition, the upper electrode 104a of the electronic device 104 is electrically connected to the lowest circuit layer 100a through the lowest contact 100b.

In this embodiment, since the stress compensation layer 106 is disposed on the second surface 101b of the redistribution layer structure 100, the stress generated by the dielectric layer 104c in the electronic device 104 may be reduced or offset by the stress compensation layer 106, so that the warpage or the curl of the semiconductor package structure 90 may be avoided.

Figure 10:
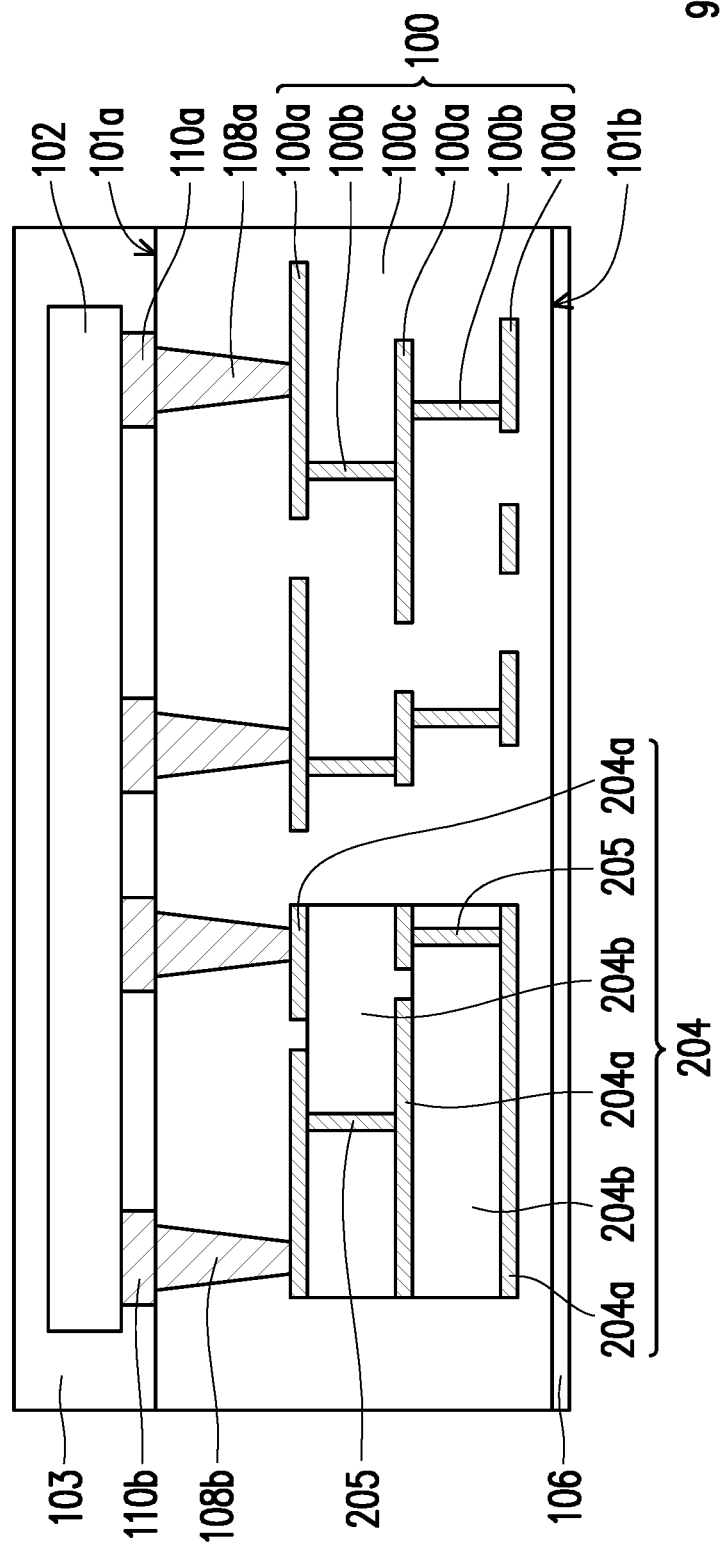
FIG. 10 is a schematic cross-sectional view of a semiconductor package structure according to the tenth embodiment of the present disclosure.

FIG. 10 is a schematic cross-sectional view of a semiconductor package structure according to the tenth embodiment of the present disclosure. In this embodiment, the same elements as in the first embodiment will be denoted by the same element symbols, and will not be described again.

Referring to FIG. 10, in this embodiment, the difference from the eighth embodiment is that in the semiconductor package structure 92, the electronic device 204 is disposed in the redistribution layer structure 100, and is electrically connected to the chip 102. The electronic device 204 includes a plurality of electrode layers 204a and dielectric layers 204b interposed between the electrode layers 204a. The electrode layers 204a are similar to the upper electrode 104a and the lower electrode 104b, and the dielectric layers 204b are similar to the dielectric layer 104c, which will not be described here. In addition, adjacent electrode layers 204a are electrically connected through the conductive vias 205. That is, in this embodiment, the electronic device 204 is a capacitor formed by stacking the plurality of electrode layers 204a. In addition, in this embodiment, the electronic device 204 includes three electrode layers 204a and two dielectric layers 204b, but the present disclosure is not limited thereto. In other embodiments, the electronic device may include more electrode layers and more dielectric layers. For example, in some embodiments, the electronic device 204 may include four electrode layers 204a and three dielectric layers 204b, and may even include twenty-one electrode layers 204a and twenty dielectric layers 204b.

In this embodiment, since the stress compensation layer 106 is disposed on the second surface 101b of the redistribution layer structure 100, the stress generated by the dielectric layers 204b in the electronic device 204 may be reduced or offset by the stress compensation layer 106, so that the warpage or the curl of the semiconductor package structure 92 may be avoided.

In the above embodiments, the semiconductor package structure does not include the carrier substrate, but the application is not limited thereto. In other embodiments, the semiconductor package structure may include a carrier substrate, which will be further described below.

Figure 11:
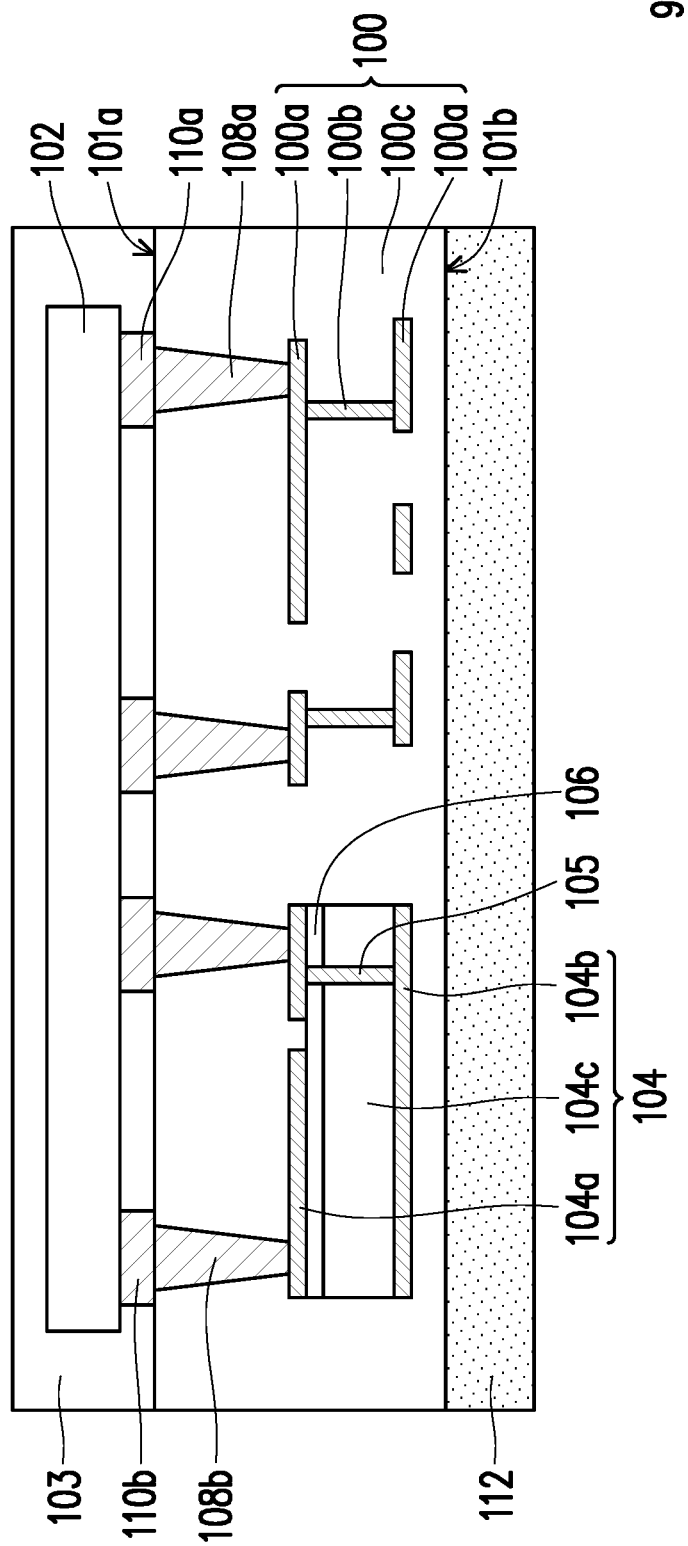
FIG. 11 is a schematic cross-sectional view of a semiconductor package structure according to the eleventh embodiment of the present disclosure.

FIG. 11 is a schematic cross-sectional view of a semiconductor package structure according to the eleventh embodiment of the present disclosure. In this embodiment, the same elements as in the first embodiment will be denoted by the same element symbols, and will not be described again.

Referring to FIG. 11, in this embodiment, the difference from the first embodiment is that the semiconductor package structure 94 includes a carrier substrate 112, and the carrier substrate 112 is disposed on the second surface 101b of the redistribution layer structure 100. The carrier substrate 112 may be a dielectric substrate, for example, a polyimide (PI) substrate, which is used to support the redistribution layer structure 100, the chip 102, and the encapsulant 103.

In addition, in the above other embodiments, the carrier substrate 112 may be disposed on the second surface 101b of the redistribution layer structure 100 according to actual requirements. In addition, in the embodiment where the stress compensation layer 106 is disposed on the second surface 101b, the stress compensation layer 106 is located between the second surface 101b of the redistribution layer structure 100 and the carrier substrate 112.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package structure, comprising:
a redistribution layer structure, having a first surface and a second surface opposite to each other;
a chip, disposed on the first surface of the redistribution layer structure, and electrically connected to the redistribution layer structure;
an electronic device, disposed in the redistribution layer structure, electrically connected to the chip, and comprising a dielectric layer disposed in the electronic device; and
a stress compensated layer, disposed in the redistribution layer structure,
wherein the dielectric layer provides a first stress between 50 Mpa and 200 Mpa in a first direction perpendicular to the second surface, and the stress compensated layer provides a second stress between 50 Mpa to 200 Mpa in a second direction opposite to the first direction, and the difference between the first stress and the second stress does not exceed 60 Mpa.

2. The semiconductor package structure of claim 1, wherein the first stress is one of tensile stress and compressive stress, and the second stress is the other of tensile stress and compressive stress.

3. The semiconductor package structure of claim 1, wherein the material of the stress compensated layer comprises silicon oxide, silicon nitride, aluminum oxide, or a combination thereof.

4. The semiconductor package structure of claim 1, wherein the material of the dielectric layer comprises zinc oxide, titanium oxide, tantalum oxide, aluminum oxide, or a combination thereof.

5. The semiconductor package structure of claim 1, wherein the electronic device comprises a capacitor, a resistor, an inductor, a filter, an antenna, a transistor, or a combination thereof.

6. The semiconductor package structure of claim 5, wherein the electronic device is a capacitor, the capacitor comprises an upper electrode, a lower electrode and the dielectric layer located therebetween, and the stress compensated layer is disposed between the upper electrode and the dielectric layer.

7. The semiconductor package structure of claim 1, wherein the stress compensated layer is disposed above the electronic device and a circuit layer of the redistribution layer structure.

8. The semiconductor package structure of claim 1, wherein the stress compensated layer is only disposed above the electronic device.

9. The semiconductor package structure of claim 1, wherein the stress compensated layer is disposed around the electronic device and a circuit layer of the redistribution layer structure.

10. The semiconductor package structure of claim 1, wherein the stress compensated layer is disposed under the electronic device and a circuit layer of the redistribution layer structure.

11. The semiconductor package structure of claim 1, wherein the stress compensated layer is only disposed under the electronic device.

12. The semiconductor package structure of claim 1, further comprising a carrier substrate disposed on the second surface.

13. The semiconductor package structure of claim 1, wherein the stress compensation layer and the dielectric layer disposed in the electronic device have substantially the same projected area.

14. A semiconductor package structure, comprising:
a redistribution layer structure, having a first surface and a second surface opposite to each other;
a chip, disposed on the first surface of the redistribution layer structure, and electrically connected to the redistribution layer structure;
an electronic device, disposed in the redistribution layer structure, electrically connected to the chip, and comprising a dielectric layer disposed in the electronic device; and
a stress compensated layer, disposed outside the redistribution layer structure,
wherein the dielectric layer provides a first stress between 50 Mpa and 200 Mpa in a first direction perpendicular to the second surface, and the stress compensated layer provides a second stress between 50 Mpa to 200 Mpa in a second direction opposite to the first direction, and the difference between the first stress and the second stress does not exceed 60 Mpa.

15. The semiconductor package structure of claim 14, wherein the first stress is one of tensile stress and compressive stress, and the second stress is the other of tensile stress and compressive stress.

16. The semiconductor package structure of claim 14, wherein the material of the stress compensated layer comprises silicon oxide, silicon nitride, aluminum oxide, or a combination thereof.

17. The semiconductor package structure of claim 14, wherein the material of the dielectric layer comprises zinc oxide, titanium oxide, tantalum oxide, aluminum oxide, or a combination thereof.

18. The semiconductor package structure of claim 14, wherein the electronic device comprises a capacitor, a resistor, an inductor, a filter, an antenna, a transistor, or a combination thereof.

19. The semiconductor package structure of claim 18, wherein the capacitor comprises a plurality of electrode layers and a plurality of the dielectric layers between adjacent electrode layers.

20. The semiconductor package structure of claim 14, wherein the stress compensated layer is disposed on the first surface and/or the second surface.

21. The semiconductor package structure of claim 14, further comprising a carrier substrate disposed on the second surface.

* * * * *